United States Patent
Honda

[11] Patent Number: 5,946,408
[45] Date of Patent: *Aug. 31, 1999

[54] PICK-UP APPARATUS AND METHOD FOR SEMICONDUCTOR CHIPS

[75] Inventor: Motoharu Honda, Shiga, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/654,926

[22] Filed: May 29, 1996

[30] Foreign Application Priority Data

May 31, 1995 [JP] Japan ................................. 7-133606

[51] Int. Cl.$^6$ ........................................................ G06K 9/00
[52] U.S. Cl. ......................... 382/149; 382/145; 382/151; 348/87; 348/126
[58] Field of Search ..................................... 382/141, 145, 382/149, 151, 304; 356/375–376; 348/86–87, 94–95, 125–126; 324/73.1, 754

[56] References Cited

U.S. PATENT DOCUMENTS 5,377,405  1/1995  Sakurai et al. ............................ 29/833
5,570,993  11/1996 Onodera et al. ......................... 356/375
5,640,101  6/1997  Kuji et al. ................................ 324/754

FOREIGN PATENT DOCUMENTS 63-11724  4/1988  Japan .
63-98782  4/1988  Japan .

*Primary Examiner*—Leo H. Boudreau
*Assistant Examiner*—Bhavesh Mehta
*Attorney, Agent, or Firm*—Whitham, Curtis & Whitham

[57] ABSTRACT

A method for sequentially picking up non-faulty chips arranged on an X-Y table. A plurality of chips disposed in an aligned arrangement is viewed by a camera in a field of view of the camera to provide an image data for enabling a preceding image recognition for a chip simultaneously with a pick-up operation for another chip. Three chip locations adjacent to each other along a moving direction of the camera are encompassed by the field of view. During the time period for a pick-up operation of a particular chip located at the center of the field of view, a preceding recognition is conducted for the succeeding chip located adjacent to and ahead of the particular chip on the basis of image data, thereby examining whether the succeeding chip is faulty or non-faulty during the pick-up operation for the particular chip. If the succeeding chip is found to be faulty, the succeeding chip is skipped for positioning a third chip for a next pick-up operation.

9 Claims, 6 Drawing Sheets

PICK-UP APPARATUS AND METHOD FOR SEMICONDUCTOR CHIPS

BACKGROUND OF THE INVENTION (a) Field of the Invention

The invention relates to a pick-up apparatus and a pick-up method and, more particularly, to a pick-up apparatus which is used in a mounting step in the manufacture of semiconductor devices, and a pick-up method used during a mounting operation of semiconductor devices.

(b) Description of the Related Art

In a mounting step during the manufacture of semiconductor devices, a plurality of semiconductor pellets or chips disposed in an aligned arrangement as divided from a semiconductor wafer is subjected to an image recognition in order to allow non-faulty chips to be picked up for mounting.

Specifically, a plurality of chips disposed in an aligned arrangement are viewed one by one by a camera, and chips disposed within a field of view of the camera are subjected to an image processing operation. In the image processing operation, image data for the chip location obtained on the basis of the image signal from the camera is stored in a frame memory, and an image recognition is applied based on the image data in order to examine if the chip (or chip location) is faulty or non-faulty. A decision to examine and determine whether a chip location is faulty or non-faulty is executed by determining the presence or absence of the chip itself at the chip location, the presence or absence of any fault in the appearance such as a notch on the chip surface, and the presence or absence of a faulty mark which may be applied to the chip surface based on the results of a previous test for electric characteristics of the chip. After the image recognition, only a chip which is determined to be non-faulty is picked up by a devoted jig, called a "collet", which applies a vacuum suction to the chip. The picked up chip is then mounted on an island or die pad of a lead frame.

In the prior art practice, as illustrated in FIG. 1, a chip 10 is subjected to an image recognition within a field of view 11 of a camera, and the operation which sequentially picks up non-faulty chips is executed in accordance with timing charts shown in FIGS. 2A and 2B.

FIG. 2A illustrates an example of a pick-up operation in which all the subject chips shown in FIG. 1 are non-faulty. In this instance, a first chip located within the field of view of the camera is subjected to an image recognition (step S1), and positioned at the pick-up position, e.g, at the center of the field of image of the camera (step S2). Upon completion of the positioning of the chip, the chip is picked up by the collet (step S3). After the pick-up operation thereof is completed, a second chip is moved by a one pitch movement into the field of view (step S4). Subsequently, the second chip located within the field of view is subjected to an image recognition (step S5), then positioned at the pick-up position (step S6) and picked up in a manner similar to that as described above. The described operations are repeated to pick up successive chips arranged in a matrix.

FIG. 2B illustrates another example of a pick-up operation in which a first and a third chips are faulty while a second chip is non-faulty. In this instance, the first chip is subjected to an image recognition within the field of view (step S11), where the first chip is determined to be faulty based on the image recognition, and accordingly, the pick-up operation thereof is not executed. A one-pitch movement occurs instead for the second chip (step S12), which is then subjected to an image recognition in the field of view of the camera (step S13), and is determined to be non-faulty. As a result, the second chip is positioned at the pick-up position (step S14) and then picked up (step S15). Upon completion of the pick-up operation, one pitch movement further takes place for the third chip (step S16), which is then subjected to an image recognition in the field of view (step S17) and determined to be faulty. Subsequently, a further one pitch movement occurs for the next succeeding chip (step S18), thus repeating the described operations.

It will be noted that in the above-described pick-up method, a chip located within the field of view of the camera is subjected to an image recognition, then positioned at the pick-up position, and finally picked up upon completion of the positioning. After completion of the pick-up operation for a chip, a one pitch movement takes place for a next chip, which is again subjected to a sequence of an image recognition, positioning and pick-up operation thereof in a similar manner.

SUMMARY OF THE INVENTION

It is an object of the invention to provide a pick-up apparatus and method which is capable of improving the throughput of the pick-up operation for mounting semiconductor chips by decreasing the time interval with which the chips are picked up.

According to the invention, there is provided a pick-up method for semiconductor chips including the steps of locating on a table a plurality of chips including first through third chips where are aligned at least in a first direction at a first pitch, establishing a field of view of a camera encompassing the first and second chips, picking up the first chip at a pick-up position, performing a preceding image recognition for the second chip during the picking up of the first chip, examining if the second chip is faulty or non-faulty based on the preceding image recognition, and if the second chip is found to be non-faulty, moving the camera relative to the table in the first direction to locate and pick up the second chip at the pick-up location.

The invention further provides a pick-up apparatus for semiconductor chips comprising a table for mounting thereon a plurality of chips including first through third chips which are aligned at least in a first direction at a first pitch, a table drive for moving the table at least in the first direction, a camera for viewing at least first and second chips at a first position and a second position, respectively, in a field of view of the camera, a pick-up device for picking up the first chip at the first position for mounting, and an image processor for performing a preceding image recognition for the second chip at the second position during a pick-up operation by the pick-up device.

In accordance with the pick-up apparatus and method of the invention, during the pick-up operation for a particular chip, an image recognition for a next chip is executed. In this manner, the image recognition of the next chip occurs in parallel with the pick-up operation for the particular chip, thereby reducing the time interval with which the chips are picked up and improving the throughput of the pick-up operation by the pick-up apparatus and method.

In the prior art practice as described before, the image recognition by the camera is not executed during the pick-up operation of a chip which has been subjected to an image recognition. The image recognition is started upon completion of the pick-up operation for the particular chip. As a result, the image recognition and pick-up operation are alternately executed, resulting in a low throughput of the pick-up operation for mounting. The invention improves the throughput of the mounting operation by simultaneous operation for a pick-up and an image recognition.

DESCRIPTION OF THE PREFERRED EMBODIMENT

Preferred embodiment of the invention will now be described with reference to the accompanying drawings.

Figure 3:
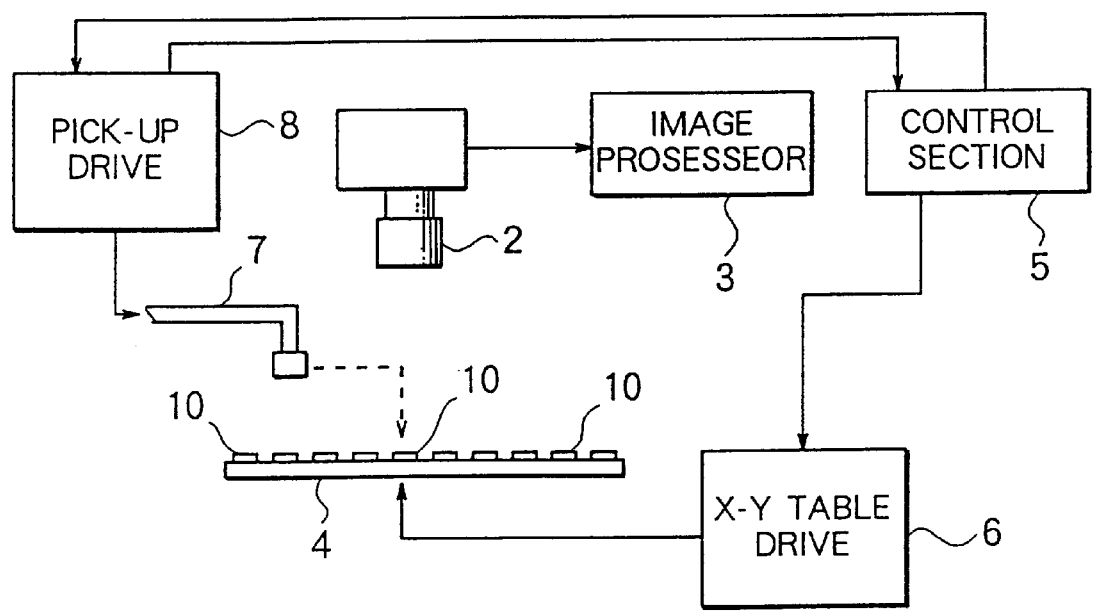
FIG. 3 is a block diagram of a pick-up apparatus according to an embodiment of the invention.

Referring first to FIG. 3 which schematically shows a pick-up apparatus according to the embodiment, a plurality of chips 10 disposed in a matrix are viewed in the field of view of a camera 2, which generates an image signal for three chip locations and provides the same to an image processor 3. It will be noted that the chips 10 are placed and positioned on an X-Y table 4 which is movable in X-and Y-directions. The image signal for the chips 10 located within the field of view of the camera 2 is processed by the image processor 3, which produces image data therefore, which is in turn stored in a frame memory not shown in the drawing. The image processor 3 further performs an image recognition based on the image data and examines if a chip 10 is faulty or non-faulty. The control section 5 controls the image processor 3 and a pick-up mechanism for the X-Y table 4. The X-Y table 4 is driven by a X-Y table drive 6 after a chip 10 is picked up by a collet 7, which is driven by a pick-up drive 8 to apply a vacuum suction to the chip 10. A combination of the collet 7 and the pick-up drive 8 constitutes the pick-up mechanism.

Figure 4A:
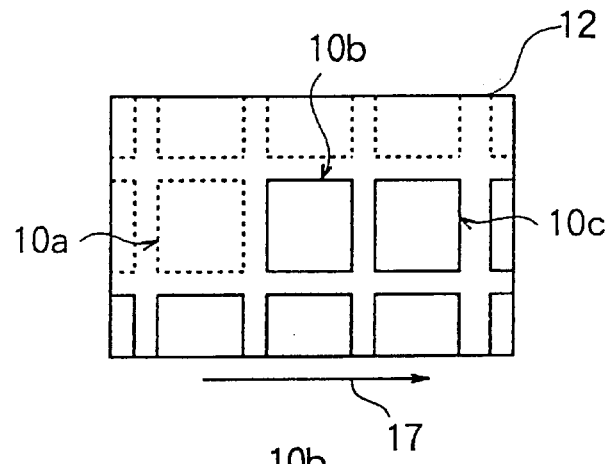
FIGS. 4A, 4B and 4C are schematic illustrations of three examples of the field of view of a camera during the image recognition in the embodiment of FIG. 3.

Referring additionally to FIG. 4A showing a field of view of the camera 2, the image recognition by the image processor 3 is executed after establishing the field of view 12 of the camera 2 so that three chip locations 10a, 10b and 10c, which are adjacent to each other in a moving direction (or sensing direction) of the camera 2 with respect to the chips, e.g., X-direction. The pick-up mechanism operates to pick up a particular chip 10b which is located at the center of the field of view 12. During the time period while the pick-up operation for the particular chip 10b located at the center of the field of view of the camera 2 is being executed, the control section 5 controls the image processor 3 to perform a preceding image recognition for a next chip 10c which is located adjacent to and ahead of the particular chip 10b, as viewed in the moving direction of the camera 2 relative to the X-Y table 4.

As a result of such preceding image recognition, the image processor 3 generates a chip data indicating whether the next chip 10c located ahead of the particular chip 10b is faulty or non-faulty, and assumes a standby mode. Upon completion of the pick-up operation for the particular chip, the standby mode mentioned above is terminated, and if the next chip 10c, which is located ahead of the particular chip 10b, has been found to be non-faulty, the next chip 10c is then positioned at the pick-up position in accordance with the data obtained by the preceding image recognition. If the next chip 10c has been found to be faulty, a two-pitch movement is executed so that a next adjacent chip located ahead of the next chip 10c is moved to the central location of the field of view of the camera.

During the image recognition, three chip locations 10a, 10b and 10c which are adjacent to each other along the moving direction, as indicated by an arrow 17, of the camera 2 are encompassed by the field of view 12 established for the camera 2. It is to be understood that chip location 10a for which the pick-up operation of the chip has been completed will be shown as broken lines in the drawings.

Figure 4B:
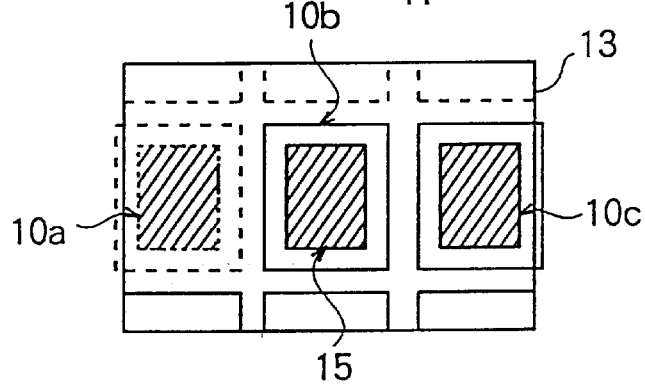
Figure 4C:
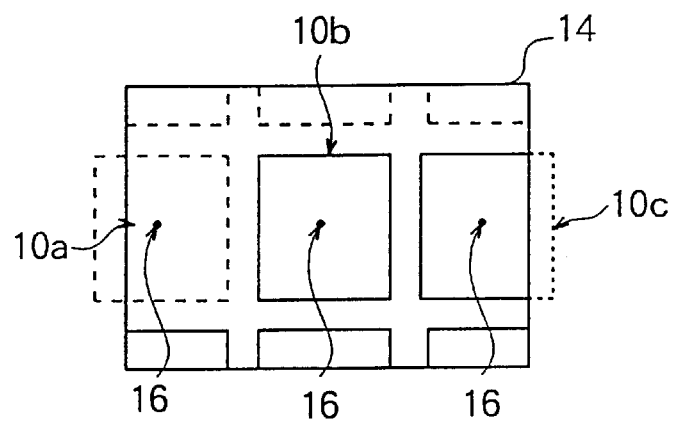

FIG. 4A and FIGS. 4B and 4C show three examples of fields of view of the camera encompassing the three chip locations as mentioned above. In the example of FIG. 4A, the field of view 12 is established so that the contours and surface images of three chips (or chip locations) 10a, 10b and 10c are viewed in the field of view 12 of the camera, among which chip 10a has been picked up and which are located adjacent to each other in the sensing direction of the camera, i.e., from left to right as indicated by the arrow 17. In the example of FIG. 4B, the field of view 13 is established so that at least a faulty mark area 15, as shown by hatching, of each of three chips 10a, 10b and 10c can be viewed in the field of view 13. In the example of FIG. 4C, the field of view 14 is established so that only the center 16 of each of chips 10a, 10b and 10c is viewed in the field of view 14. It is to be noted that the faulty mark area 15 in FIG. 4B represents an area where a faulty mark is applied to the surface of a faulty chip after a test is executed for the electric characteristics thereof.

Each of the three examples of the field of view 12, 13 and 14 can be established to encompass three adjacent chip locations 10a, 10b and 10c based on a calculation using three parameters including the chip size, the size of a faulty mark area 15 relative to the chip size, and the size of a clearance between adjacent chips, which is generally referred to as a "street". The individual fields of view 12, 13 and 14 are automatically selected depending on the conditions in accordance with the chip size and the accuracy required in positioning the chip during the pick-up operation.

The field of view 12 shown in FIG. 4A allows a detection of not only a faulty mark, but also the presence or absence of any fault in the appearance such as a notch on the chip surface. The field of view 13 shown in FIG. 4B allows the detection of the presence or absence of a faulty mark, and the field of view 14 shown in FIG. 4C allows the detection of the presence or absence of a chip itself at each of the locations 10a, 10b and 10c. However, it is to be understood that even with the field of view 14 shown in FIG. 4C, a detection of the presence or absence of a faulty mark is possible as with the field of view 13 shown in FIG. 4B, if such faulty mark is applied at the chip center 16.

Figure 1:
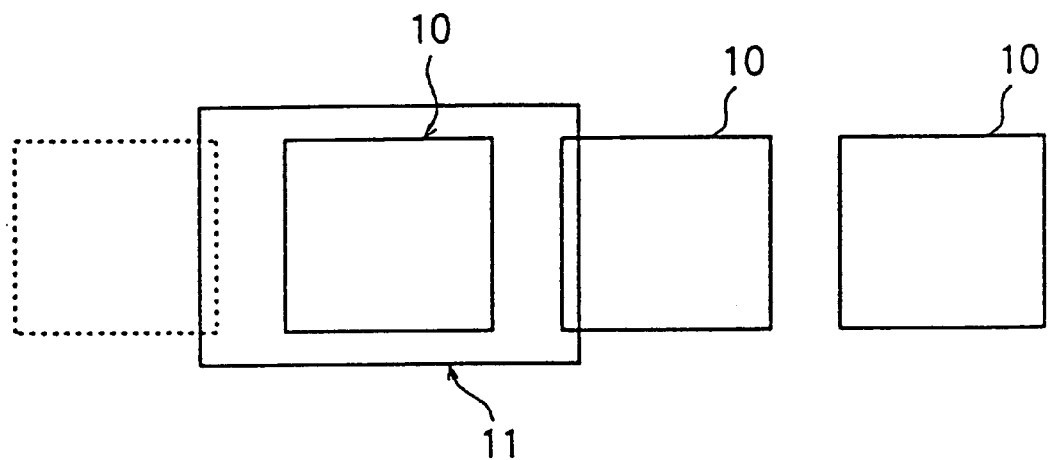
FIG. 1 is a schematic illustration of the field of view of a camera during an image recognition in a prior art method.
Figure 2A:
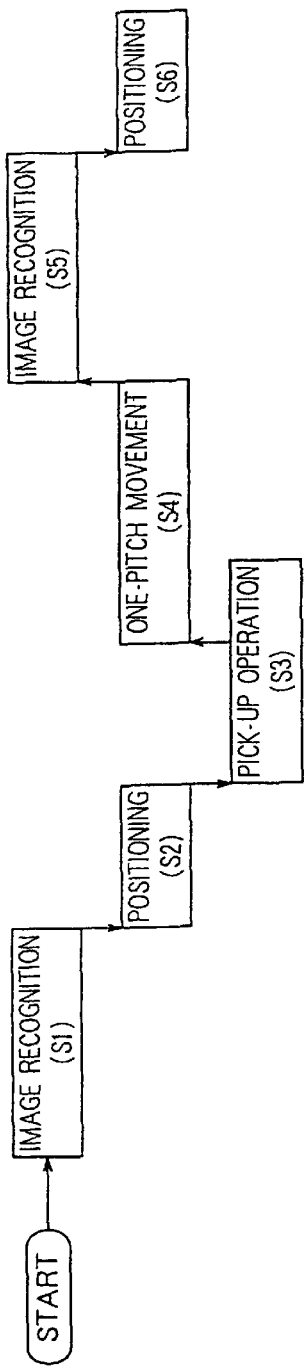
FIGS. 2A and 2B are timing charts each illustrating an example of the image recognition and the pick-up operation of the prior art.
Figure 2B:
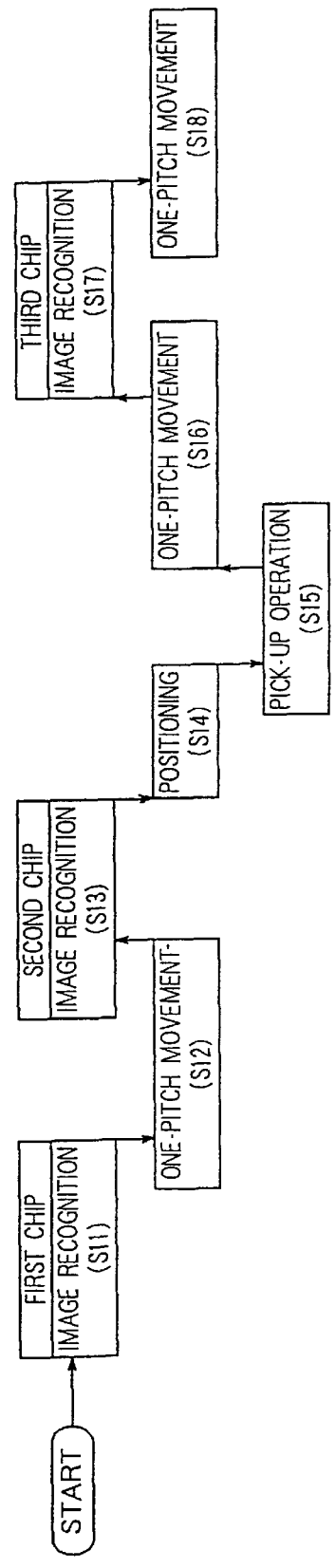

It will be noted that the field of view 12 shown in FIG. 4A is preferable because not only the presence or absence of a faulty mark, but also the presence or absence of any fault in the appearance such as a notch can be detected by the field of view 12, as mentioned above. However, the field of view 13 shown in FIG. 4B or the field of view 14 shown in FIG. 4C may be selected by taking into consideration the chip size and the accuracy required in positioning the chip during the pick-up operation. It is also to be noted that the field of view 11 illustrated in FIG. 1 which contains only one chip may be also selected, considering the chip size or the accuracy in positioning the chip during the pick-up operation. In this case, the pick-up operation for a particular chip is executed after moving the X-Y table for locating the succeeding chip in the field of view 11.

Figure 5:
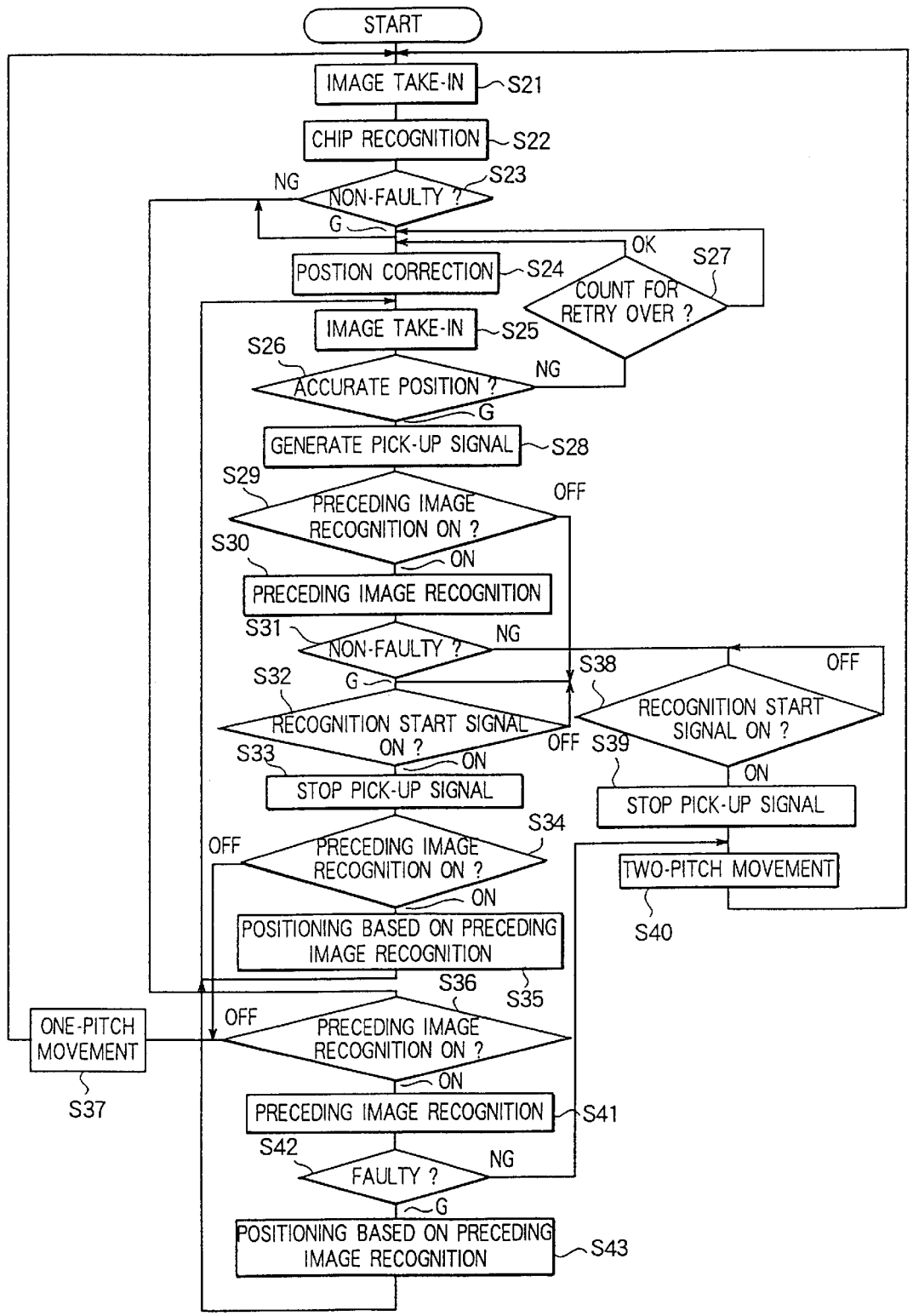
FIG. 5 is a flow-chart of the pick-up method executed by the pick-up apparatus of FIG. 3.

The image recognition and the pick-up operation for the chips 10a, 10b and 10c in the field of view selected in the manner mentioned above will now be described with reference to the flow chart shown in FIG. 5 as well as the timing charts shown in FIGS. 6A and 6B. The operation of the pick-up apparatus of the embodiment will be first described with reference to FIGS. 3, 4A and 5.

In a first case, assuming that all the subject chips mentioned below are non-faulty, three chip locations 10a, 10b and 10c are viewed by the camera 2 from which an image signal is supplied to the image processor 3. The image processor 3 processes the image signal to provide image data or the chip locations 10a, 10b and 10c (steps S21 and 22). The image recognition by the image processor 3 is started based on the image signal for the first chip 10b located at the central location of field of view 12, thereby detecting the presence or absence of a first chip 10b and of any fault in the appearance thereof, and the presence or absence of a faulty mark on the first chip 10b. If the first chip 10b is determined to be non-faulty (step S23), the image recognition for the first chip 10b is completed.

Upon completion of the image recognition of the first chip 10b, the control section 5 delivers a positioning signal which controls the X-Y table 6 of the pick-up mechanism to actuate the X-Y table 4 in order to accurately position the non-faulty chip 10b at the center of the field of view. After the positioning of the first chip 10b is completed by repeating the steps of correction of the position (step S24), image recognition (step S25) and decision whether or not an accurate positioning can be reached (step S26), the control section 5 delivers a pick-up signal which controls the pick-up drive 8 to actuate the collet 7 (step S28) to allow the first chip 10b located at the pick-up position, i.e., at the center of the field of view 12, to be picked up by the collet 7. The number of repetitions of the steps S24 through S26 is counted for generating an alarm of excess repetitions, in order to obtain optimal conditions for the pick-up apparatus (step S27).

During the time period while the pick-up operation for the first chip 10b is being executed between steps S28 and S33, a second chip 10c, which is located adjacent to and ahead of the first chip 10a, as viewed in the moving direction of the camera 2 with respect to the chips, is subjected to the preceding image recognition by the image processor 3 (steps S29 and S30). The preceding image recognition, which detects the presence or absence of the chip itself, the presence or absence of any fault in the appearance and the presence or absence of a faulty mark applied to the second chip 10c, determines whether or not the second chip 10c is non-faulty. In this example, the second chip 10c is found to be non-faulty (step S31), whereupon the image processor for preceding image recognition assumes a standby mode for waiting generation of a recognition start signal. When the pick-up operation is finished by the pick-up drive, a recognition start signal for the third chip is generated (step S32) and the pick-up signal is stopped from the control section (step S33).

After the image processor 3 is turned active from the standby mode, positioning for the second chip 10c is executed based on the preceding image recognition therefor (step S35), followed by a return to steps for an accurate positioning (steps S25 and S26). The repetition for the correction is not necessary in steps S24 to S26 because of the accurate positionig obtained by the recognition. After the second chip 10c is positioned at the pick-up position, the pick-up operation for the second chip 10c and a preceding image recognition for the third chip adjacent to the second chip 10c are simultaneously executed (step S28 to step S32), similarly to the case for the first and second chips.

Figure 6A:
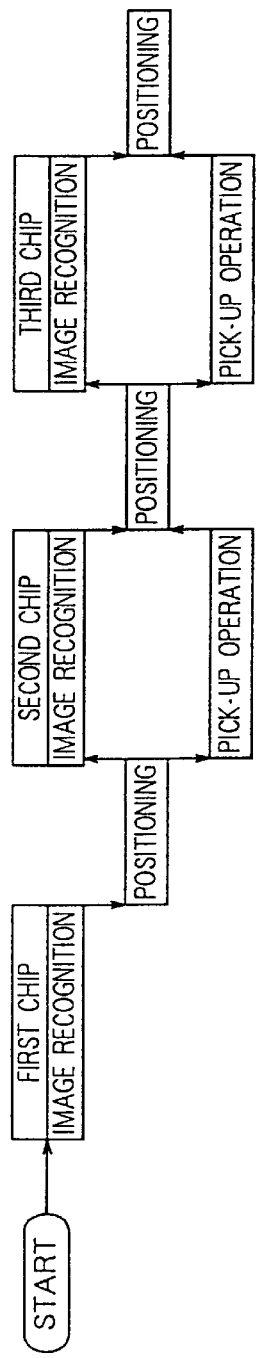
FIGS. 6A and 6B are timing charts each for illustrating an example of the timing for simultaneous image recognition and pick-up operation in the flow chart of FIG. 5.

As shown in FIG. 6A, a pick-up operation for the first chip (from step S21 to step S26) and a preceding image recognition for the second chip (from step S29 to step S31) are simultaneously executed, resulting in time saving. Similarly, a pick-up operation for the second chip and a preceding image recognition for the third chip are simultaneously executed.

Another case will be described in which the first chip 10b and the third chip are faulty while the second chip 10c and a fourth chip are non-faulty. The three chip locations 10a, 10b and 10c are viewed by the camera 2 and the image signal from the camera 2 is processed by the image processor 3 to provide image data for the first chip 10b located at the center of the field of view 12 of the camera, similarly to the case as described for the first case (steps S21 and S22).

The image recognition for the first chip 10b is executed based on the image data in order to detect the presence or absence of the chip itself, any fault in the appearance thereof and a faulty mark applied the chip surface. After the first chip 10b is determined to be faulty (step S23), the image processor turns the preceding image recognition off (step S36), whereupon the second chip 10c which is located adjacent to and ahead of the first chip 10b is moved to by one-pitch movement (step S37) and is subjected to the image recognition by the image processor 3 (steps S21 and S22). Since the second chip 10c is found to be non-faulty (steps S42 and S43), a preceding image recognition is turned ON (step S36), and positioning and pick-up operation for the second chip and preceding image recognition for a third chip are executed (steps S43 to S26), similarly to the first chip 10a in the first case.

After the third chip is found to be faulty (step S31), the image processor assumes a standby mode. Upon completion of the pick-up of the second chip 10c, a further preceding image recognition start signal is fed to the image processor (S38). After the control section stops the pick-up signal (step S39), a two-pitch movement is executed on the basis of the preceding image recognition for the second chip 10c (step S40). Namely, the addition of one pitch to the usual one pitch movement occurs because the third chip is found to be faulty. The fourth chip now located at the central location of the field of view is then subjected to a sequence of an image recognition, positioning and pick-up operation, similarly to the first chip 10b (steps S21 to S33). In a third case, if both the first and second chips are found to be faulty (steps S23, S36 to S42), a two-pitch movement is also executed (step S40) for locating the third chip at the central location of the field of view.

Figure 6B:
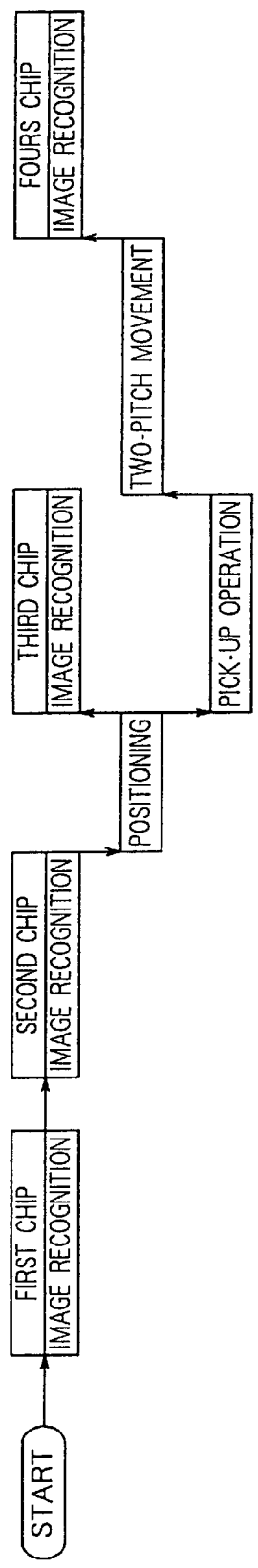

As shown in FIG. 6B illustrating the second case, pick-up operation for the second chip (step S23, and steps S36 to S43) and preceding image recognition for the third chip (from step S29 to step S31) are simultaneously executed to enable a pick-up operation during a preceding image recognition for time saving.

In the above embodiment, three chip locations are viewed in the field of view of the camera in which the leftmost chip location is vacant. This is based on the fact that the moving direction of the camera is iteratively reversed in the embodiment at the last chip located at the rightmost or leftmost end of the row. In this case, after the reversion of the sensing direction to the left, the chip location 10c in the field of view 12 is vacant in the next row and the preceding image recognition is applied to the chip location 10a.

Since above embodiment is described only for an example, the present invention is not limited to such embodiment and it will be obvious for those skilled in the art that various modifications or alterations can be easily made based on the above embodiment within the scope of the present invention.

What is claimed is:

1. A pick-up method for semiconductor chips including the steps of:

locating on a table a plurality of chips including first through third chips aligned at least in a first direction at a first pitch, automatically selecting one of at least two fields of view of a camera encompassing at least said first and second chips, said at least two fields of view being automatically selected based on chip size and a chip position accuracy desired during a chip pick-up operation, picking up said first chip at a pick-up position, performing a preceding image recognition for said second chip during said picking up of said first chip, examining if said second chip is faulty or non-faulty based on said preceding image recognition, if said second chip is found to be non-faulty, moving said camera relative to said table in said first direction to locate and pick up said second chip at said pick-up location, moving said camera relative to said table by double said first pitch to locate said third chip at said pick-up position if said second chip is found to be faulty, said camera being moved to locate said third chip at said pick-up position without performing an image recognition of said third chip during said step of picking up said first chip.

2. A pick-up method as defined in claim 1 further including the steps of performing image recognition for said third chip, and examining if said third chip is faulty or non-faulty, and moving said camera relative to said table by said first pitch if said third chip is faulty.

3. A pick-up method as defined in claim 2 further including the step of picking up said third chip if said third chip is non-faulty and simultaneously performing a preceding image recognition for a fourth chip of said plurality of chips adjacent to said third chip.

4. A pick-up method as defined in claim 1 wherein said preceding image recognition is applied with respect to at least one of presence or absence of said second chip itself, presence or absence of any fault on the surface of said second chip and presence or absence of a faulty mark on the surface of said second chip.

5. A pick-up method as defined in claim 1, wherein said fields of view include a first field of view encompassing three chip locations including said first and second chips, a second field of view sufficient to allow viewing of a fault or fault mark on a surface of a chip, and a third field of view encompassing centers of at least said first and second chips.

6. A pick-up method as defined in claim 1, wherein each of said fields of view encompass three adjacent chip locations as a result of a calculation performed based on the following parameters:

a) chip size;

b) a size of a faulty mark area relative to said chip size; and c) a size of a clearance between said three chip locations.

7. A pick-up apparatus for semiconductor chips comprising:

a table for mounting thereon a plurality of chips including first through third chips aligned at least in first direction at a first pitch, a table drive for moving said table at least in said first direction, a camera for viewing at least first and second chips at a first position and a second position, respectively, in a field of view of said camera, said camera including means for automatically selecting said field of view from at least two fields of view based on chip size and a chip position accuracy desired during a chip pick-up operation, a pick-up device for picking up said first chip at said first position for mounting, an image processor for performing a preceding image recognition for said second chip at said second position during pick-up operation by said pick-up device, wherein said image processor examines if said second chip is faulty or non-faulty, and said table drive moves said table by double said first pitch if said second chip is found to be faulty, said table being moved to locate said third chip under said pick-up device without performing an image recognition of said third chip during picking up said first chip.

8. A pick-up apparatus as defined in claim 7, wherein said fields of view automatically selected by said selecting means include a first field of view encompassing three chip locations including said first and second chips, a second field of view sufficient to allow viewing of a fault or fault mark on a surface of a chip, and a third field of view encompassing centers of at least said first and second chips.

9. A pick-up apparatus as defined in claim 7, wherein each of said fields of view encompass three adjacent chip locations as a result of a calculation performed based on the following parameters:

a) chip size;

b) a size of a faulty mark area relative to said chip size; and c) a size of a clearance between said three chip locations.

* * * * *